United States Patent [19]

Brefka

[11] 4,092,698
[45] May 30, 1978

[54] PROTECTIVE CASE FOR ELECTRICAL INSTRUMENTS ON CIRCUIT BOARDS

[75] Inventor: Paul E. Brefka, Southboro, Mass.

[73] Assignee: Analog Devices, Incorporated, Norwood, Mass.

[21] Appl. No.: 812,059

[22] Filed: Jul. 1, 1977

Related U.S. Application Data

[63] Continuation of Ser. No. 723,780, Sep. 16, 1976, abandoned.

[51] Int. Cl.$^2$ .............................................. H05K 5/00
[52] U.S. Cl. ...................................... 361/399; 361/346
[58] Field of Search ................................ 361/399, 346

[56] References Cited

U.S. PATENT DOCUMENTS

| | | | |
|---|---|---|---|
| 3,412,255 | 11/1968 | Rogers et al. | 200/295 |
| 3,674,961 | 7/1972 | Wright, Jr. | 200/295 |
| 3,793,563 | 2/1974 | Brefka | 361/346 |

*Primary Examiner*—David Smith, Jr.
*Attorney, Agent, or Firm*—Parmelee, Johnson, Bollinger & Bramblett

[57] ABSTRACT

A protective case for an electrical instrument on a circuit board, arranged to mount the instrument upon a panel in an opening provided therein. The case is characterized by a housing having an end opening for introduction of the circuit board therein and a snap-in mounting structure for automatically and securely mounting a circuit board within the housing. The mounting structure includes means forming a ledge, provided for example by four corner platforms molded into the housing, for supporting one side of the circuit board. Two pairs of opposed resilient fingers, preferably molded integrally with the walls of the housing, extend with an inward cant along the path of the circuit board from opposite interior sides of the housing to be flexed outwardly by the edges of the circuit board as it is introduced into the housing. The resilient fingers terminate in front faces, preferably formed with beveled stepped surfaces, which are spaced from the ledges to allow the resilient fingers to flex inwardly to fit their front faces against the opposite side of the circuit board when it is positioned with its one side in contact with the ledge. The circuit board thus becomes securely mounted in the housing automatically upon its introduction therein, without resort to separate fastening means or tools. The case further has a back wall apertured to receive connector pins on the circuit board, a front cover, and resilient catches extending outwardly from other side walls of the housing for attachment of the housing to an instrument panel.

11 Claims, 8 Drawing Figures

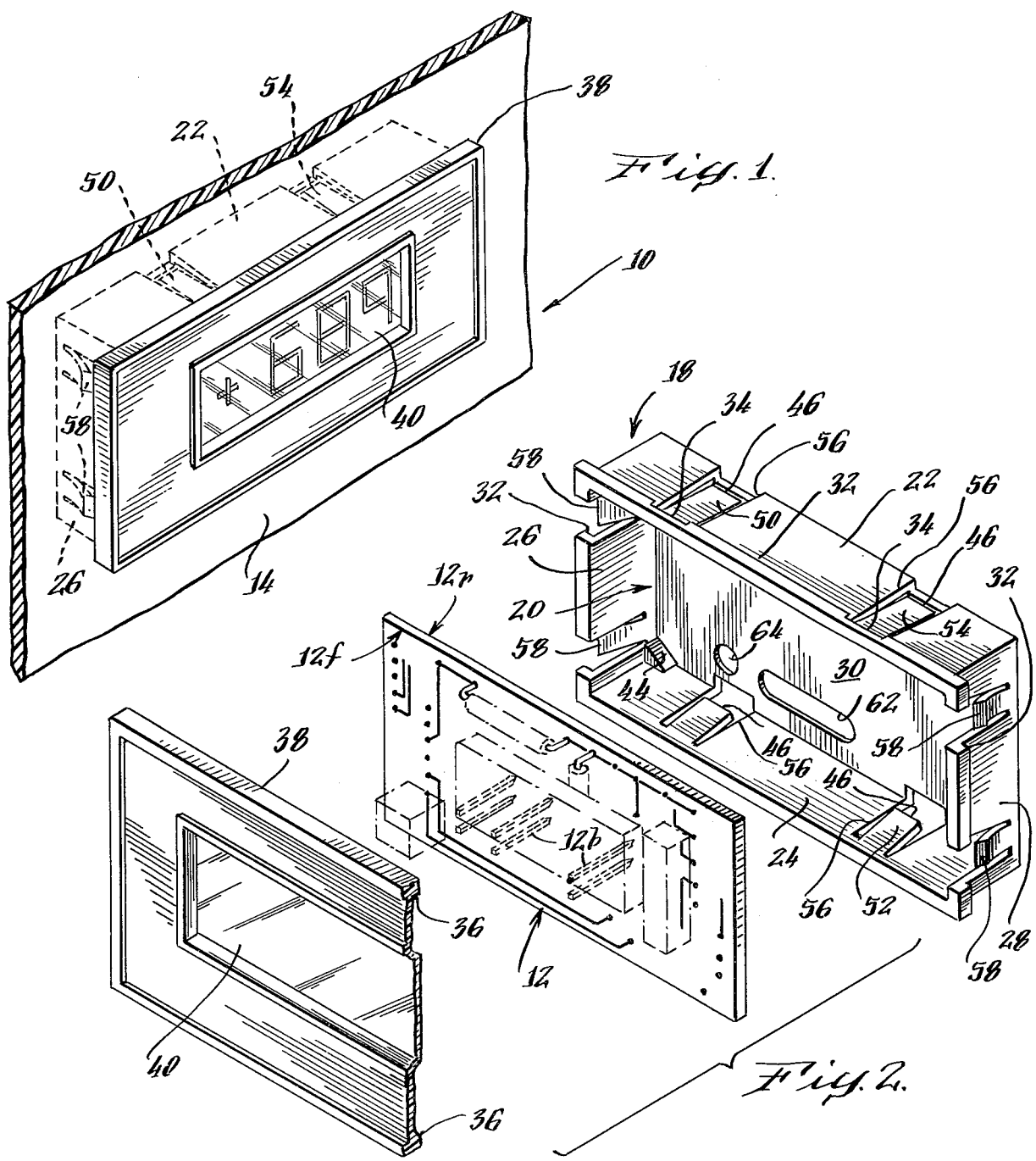
Fig. 1.
Fig. 2.
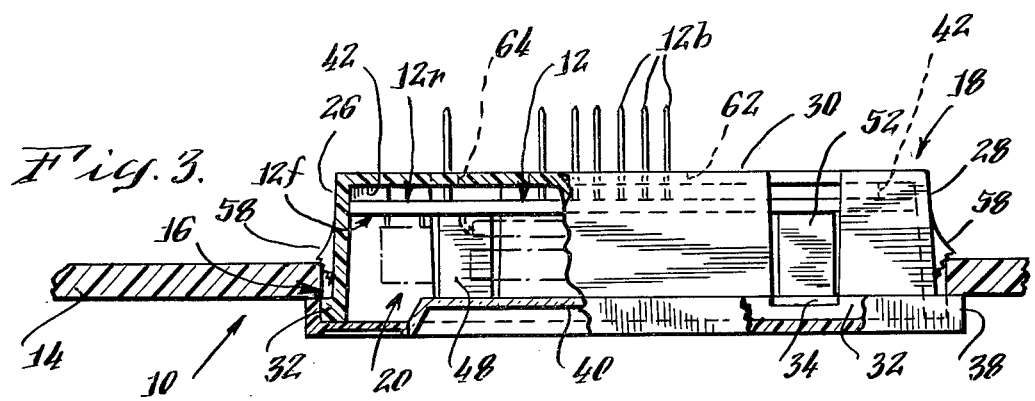
Fig. 3.

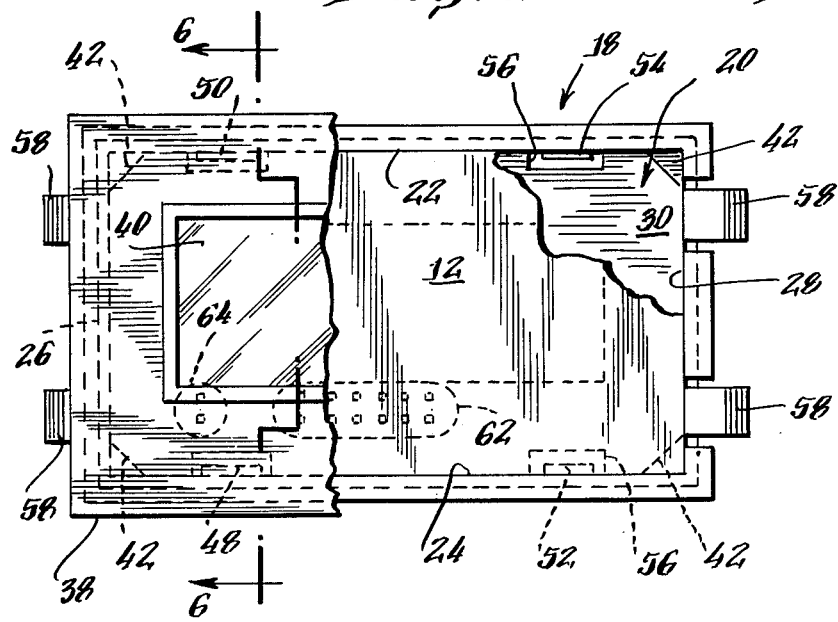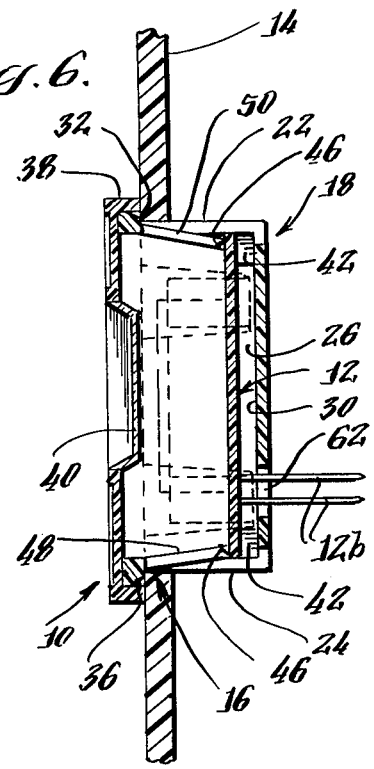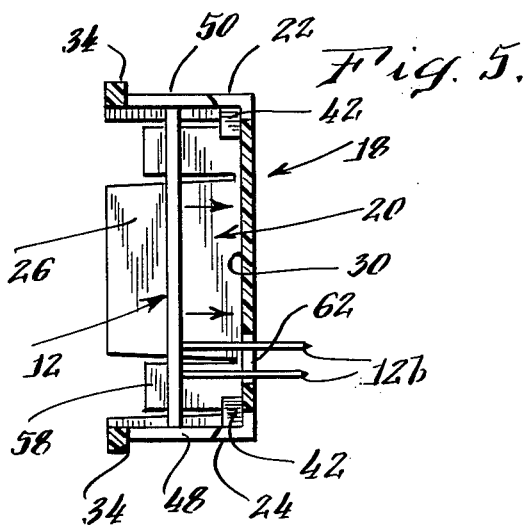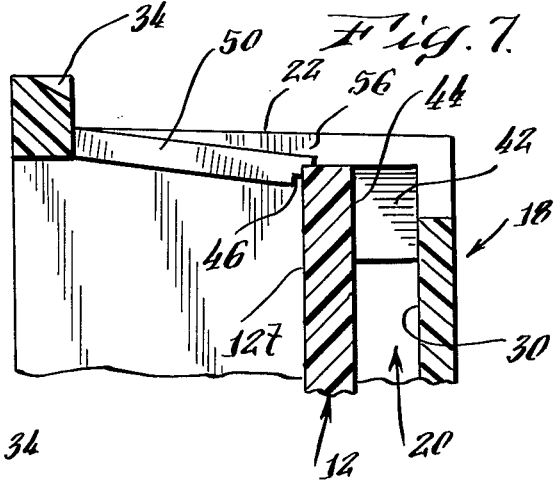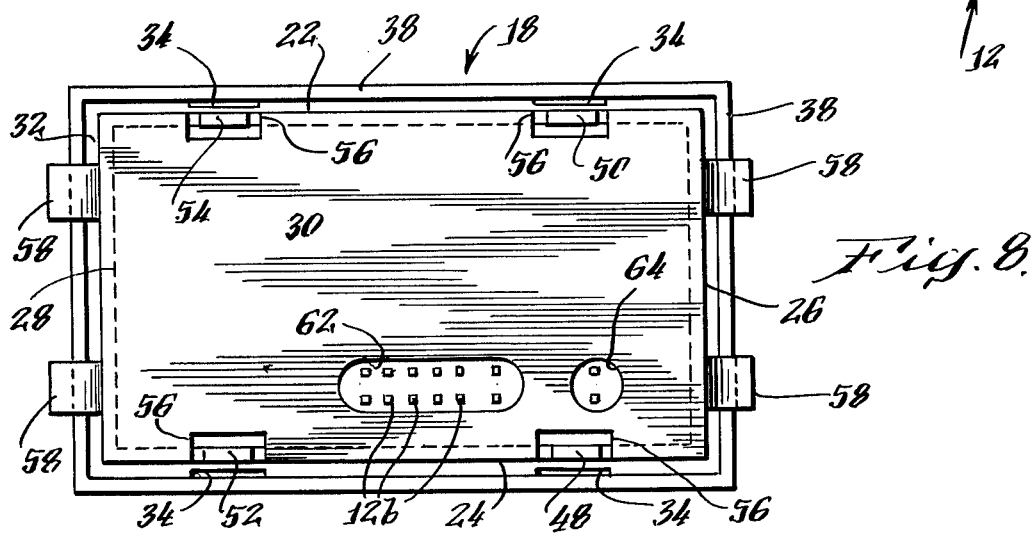

PROTECTIVE CASE FOR ELECTRICAL INSTRUMENTS ON CIRCUIT BOARDS

This is a continuation of application Ser. No. 723,780 filed Sept. 16, 1976 now abandoned.

BACKGROUND OF THE INVENTION

1. Field of the Invention

This invention relates to cases or housings for electrical instruments, and more particularly to cases for enclosing electrical instruments formed on circuit boards and for then mounting them upon an instrument panel in an opening provided therein. An example of the use of such cases is in the enclosing and mounting of digital panel meters.

2. Description of the Prior Art

Known cases for electrical instruments on circuit boards generally mount the instruments therein with conventional fastening elements such as screws, potting compound, and the like. Accordingly, mounting of the instruments in protective cases can be time consuming, tedious and expensive both in terms of parts and labor. These and other drawbacks of known constructions for protective cases tend to make such cases expensive and difficult to use.

SUMMARY OF THE INVENTION

A principal object of the present invention is to provide an improved protective case for electrical instruments on circuit boards. Particular objects of the present invention are to provide such instruments with a case which permits easy and rapid assembly of the instrument into the case, which is easily manufactured, which is capable of mounting circuit boards with some dimensional variation, and which neither adds to the required size of the case or interferes with other parts thereof. Still another object of the invention is to provide a protective case which is more suitable for commercial manufacture and assembly.

In a particular embodiment of the invention to be described hereinbelow in detail, the protective case for an electrical instrument on a circuit board comprises a housing having an end opening for introduction of the circuit board therein, and a snap-in mounting structure for automatically mounting the circuit board within the housing. The mounting structure includes means within the housing forming a ledge for supporting one side of a circuit board introduced into the housing, and at least one pair of resilient fingers extending with an inward cant along the path of the circuit board from opposite interior sides of the housing and terminating in front faces spaced above the plane of the ledge means. The resilient fingers are flexed outwardly by the edges of the circuit board as it is introduced into the housing and then flex inwardly as the circuit board edge clears the front faces of the fingers to position the fingers against the opposite side of the circuit board when its one side is in contact with the ledge means. This arrangement permits the circuit board to be securely mounted in the housing automatically upon its introduction therein, without resort to separate fastening means or tools. In additional aspects of the invention, the ledge means comprises ledges in the corners of the housing for engaging the corners of the circuit board, and the ledges and resilient fingers are molded integrally with the remainder of the housing. The case includes a back wall apertured to receive connector pins extending from the circuit board. In one preferred aspect, a front cover is arranged with a snap-fit arrangement over the end opening through which the circuit board is introduced, and additional resilient catches extend outwardly from opposite exterior sides of the housing for engagement of the case to an instrument panel, and thus all assembly steps for the housing, including assembly of the instrument and housing, assembly of the front cover and housing, and assembly of the case to an instrument panel, can be accomplished without resort to separate fastening means or tools.

Other objects, aspects and advantages of the invention will be pointed out in, or apparent from, the detailed description hereinbelow, considered together with the following drawings.

DESCRIPTION OF THE DRAWINGS

FIG. 1 is a perspective view of a protective case constructed according to the principles of the present invention, showing it as attached to an instrument panel and containing a digital panel meter;

FIG. 2 is an exploded perspective view of the case shown in FIG. 1;

FIG. 3 is a plan view of the case shown in FIG. 1, with portions in section;

FIG. 4 is a front elevation of the case of FIG. 1, with portions of the front cover and circuit board removed;

FIG. 5 is a vertical section showing a circuit board partly introduced into a housing;

FIG. 6 is a section on lines 6—6 of FIG. 4;

FIG. 7 is a partial sectional view similar to FIG. 6, showing the construction of the circuit board mounting fingers in enlarged scale; and FIG. 8 is a rear elevation of the case of FIG. 1.

DESCRIPTION OF THE PREFERRED EMBODIMENT

FIG. 1 illustrates a protective enclosure or case 10 constructed in accordance with the principles of the present invention. The case 10 houses an electrical instrument, such as the digital panel meter shown in FIG. 1, on a rectangular circuit board 12 and is arranged for mounting upon an instrument panel 14 having an opening 16 provided therein (see, e.g., FIGS. 3 and 6). As shown in FIG. 2, case 10 has an injection molded housing 18 with a rectangular front end opening 20 for introduction of circuit board 12 therein, a rectangular cross section formed by four side walls 22, 24, 26, and 28, and a rear wall 30. A peripheral flange 32 extends outwardly from the front edges of the side walls and contains notches 34 in its rear edge to receive detents 36 on a peripheral rim 38 of a front cover 40. The front cover 40 is engaged with a snap fit to housing 18 simply by pressing it over flange 32 so that the detents 36 will snap into notches 34.

In order to provide for mounting a circuit board 12 therein, housing 18 is provided with four corner ledges 42 with upper surfaces 44 for supporting the rear surface 12r of circuit board 12. The corner ledges 42 are molded along with the rest of the housing in a triangular shape, and provide substantially no interference with electrical elements on circuit board 12. The front surface 12f of circuit board 12 is engaged by bevelled front faces 46 at the ends of opposed pairs or resilient fingers 48, 50 and 52, 54 which extend with an inward cant from opposite interior sides of walls 22 and 24 into the interior of housing 18. As shown for example in FIG. 2, the fingers 48 through 54 are formed integrally with housing 18, e.g., from injection molded plastic, in openings 56 in the side walls 22 and 24. Accordingly, as a circuit board 12 is introduced into housing 18, the resilient fingers 48 through 54 engage the edge of circuit board 12 and flex outwardly. The opposed fingers tend to center the circuit board in the housing, and their limited surface area minimizes frictional resistance.

The front faces 46 of the resilient fingers are spaced away from the plane of the ledge surfaces 44 and, as shown for example in FIG. 7, the front faces are bevelled and formed with a succession of steps or ridges which are spaced closely together and which are capable of engaging the edge of the circuit board 12 around its front surface 12f. Accordingly, as the circuit board 12 is introduced into housing 18, as shown in FIG. 5, the resilient fingers first will flex away from the edge of the circuit board. When the circuit board 12 is against the ledge surfaces 44, the bevelled front faces 46 will permit the resilient fingers 48 through 54 to flex inwardly to bring the stepped front faces 46 into engagement with the circuit board, securely and automatically mounting the circuit board within housing 18.

Because the front faces 46 are bevelled and stepped, circuit boards 12 of varying thickness can be mounted, and in addition, circuit boards of slightly varying rectangular dimensions can be accommodated thus eliminating any need for exact dimensional tolerances.

For mounting of the prospective case 10 into oenings 16 in instrument panel 14, housing 18 is provided with four outwardly extending resilient catch members 58 mounted in opposition in side walls 26 and 28, in the manner described in my U.S. Pat. No. 3,793,563. As shown in FIG. 3, the resilient catches 58 have bevelled and stepped front faces 60 which engage one side of the instrument panel 14, the other side resting against flange 32. The front cover 40, as shown in FIG. 3, fits flush with instrument panel 14, and can be removed while leaving housing 18 attached to panel 14.

As shown in FIGS. 2, 3, 5, 6 and 8, the rear wall 30 of housing 18 contains apertures 62 and 64 to receive connecting pins 12p extending from circuit board 12. The portions of pins 12p which extend through rear wall 30 thus are available for attachment to an electrical plug connector (not shown).

A protective case 10 constructed in accordance with the present invention thus allows a circuit board to be easily and automatically installed therein without fasteners or tools. Fewer parts are required, and labor is reduced markedly. The ledges 42 and resilient fingers 48 through 54 are easily provided using conventional plastic injection molding techniques. A circuit board 12 is secured firmly and positively without any problems analogous to the undertightening or overtightening of a screw fastener. The resilient fingers adapt to different sizes and thicknesses of circuit boards and do not require exact dimensioning. In addition, the resilient fingers do not occupy much space and do not interfere with any of the other features of the protective case provided for attachment of the case to an instrument panel, or for attachment of the front cover.

Although a specific embodiment of the invention has been disclosed herein in detail, it is to be understood that this is for the purpose of illustrating the invention and should not be construed as necessarily limiting the scope of the invention, since it is apparent that many changes can be made to the disclosed structures by those skilled in the art to suit particular applications.

I claim:

1. A protective case for a panel-mounted electrical instrument of the type having internal electrical circuitry on a circuit board, said protective case comprising:
    a housing having four side walls disposed about and at right angles to an end wall, said housing also being formed with an end opening opposite said end wall;
    ledge means formed within the housing adjacent the side walls thereof, the surfaces of said ledge means facing said end opening providing a planar support for the circuit board;
    a first set of resilient fingers formed integrally with an opposed pair of said side walls, said first set of fingers being located in corresponding openings in said pair of side walls and formed to extend towards said end wall along the path of movement of the circuit board as it is being inserted through said end opening towards said ledge means, said first set of fingers terminating in bevelled front faces spaced above said plane of the ledge means; said first set of resilient fingers extending inwardly of the corresponding side walls and arranged to fit against the outward side surface of the circuit board when its inward side surface is in contact with said ledge means;
    a second set of resilient fingers formed integrally with an opposed pair of said side walls of the housing, said second set of fingers being formed in corresponding openings in the respective side walls, said second set of resilient fingers extending towards said end opening in a direction approximately parallel to but opposite to the direction of extension of said first set of resilient fingers, said second set of fingers extending outwardly of said respective side walls with the ends of said second set of fingers spaced from said end opening to provide for mounting said housing to an instrument panel by gripping the panel between a portion of the housing at said end opening and the ends of said second pair of resilient fingers;
    whereby all assembly steps for the case, comprising mounting the circuit board in the case and securing the case in a panel, may be performed without resort to separate fastening means or tools.

2. A protective case for an electrical instrument as claimed in claim 1, further comprising:
    flange means on the housing around the end opening thereof, to engage said instrument panel to provide for gripping thereof; and
    a front cover snap-fitting to the housing flange means over the end opening.

3. A protective case for an electrical instrument of the type including a circuit board to be held firmly fixed therein, the combination comprising:
    a molded-plastic housing having side wall means and an end opening for introduction of the circuit board therein;
    a snap-in mounting structure for mounting the circuit board within the housing, the mounting structure including:
    means molded within the housing forming a ledge presenting a planar surface for supporting marginal portions of one side surface of a circuit board introduced into said housing through said opening; and
    at least one pair of resilient fingers molded integrally with said side wall means and extending along the path of the circuit board as it moves inwardly from said end opening, said fingers being located in respective openings in opposite side walls of the housing, said fingers extending in a direction away from said end opening and terminating in front faces spaced above the plane of said ledge means and arranged to fit against the outer surface of the circuit board when its inner surface is in contact with said ledge, the resilient fingers being formed with an inward cant so that they are engaged and flexed outwardly by the side edges of the circuit board as the board is introduced into the housing through said end opening and then resiliently flex inwardly as the circuit board clears said front faces so that said front faces fit against and hold said circuit board tightly in position against said ledge, thereby to permit the circuit board to be mounted in said housing automatically upon its introduction therein, without resort to separate fastening means or tools.

4. A protective case for an electrical instrument as claimed in claim 3 wherein said front faces are bevelled and have a succession of steps provided therein for engaging the marginal portions of circuit boards of varying thickness.

5. A protective case for an electrical instrument as claimed in claim 3 wherein said housing is rectangular to receive a rectangular circuit board, said ledge means comprising ledges at each interior corner of the housing, at the intersection of the walls thereof.

6. A protective case as claimed in claim 5, comprising two pairs of opposed resilient fingers.

7. A protective case for an electrical instrument as claimed in claim 6 wherein said two pairs of resilient fingers are rectangular in outline.

8. A protective case for an electrical instrument as claimed in claim 3 further comprising outwardly extending resilient catches for mounting said housing to an instrument panel.

9. A protective case for an electrical instrument as claimed in claim 3 of the type including a circuit board with connector pins extending therefrom, wherein the housing has a rear wall with apertures therein for receiving said connector pins.

10. A protective case for an electrical instrument as claimed in claim 3 further comprising a front cover fitting over the end opening through which the circuit board is introduced.

11. A protective case for an electrical instrument of the type including a circuit board to be held firmly fixed therein, the combination comprising:

a rigid housing having side wall means and an end opening for introduction of the circuit board therein;

a snap-in mounting structure for mounting the circuit board within the housing, the mounting structure including:

means within the housing forming a ledge presenting a surface for supporting marginal portions of one side surface of a circuit board introduced into said housing through said end opening; and at least one pair of resilient fingers integral with said side wall means and extending along the path of the circuit board as it moves inwardly from said opening, said fingers being located in respective openings in opposite side walls of the housing, said fingers extending in a direction away from said end opening and terminating in front faces spaced above said ledge means and arranged to fit against the outer surface of the circuit board when its inner surface is in contact with said ledge, the resilient fingers being formed with an inward cant so that they are engaged and flexed outwardly by the side edges of the circuit board as the board is introduced into the housing through said end opening and then resiliently flex inwardly as the circuit board clears said front faces so that said front faces fit against and hold said circuit board tightly in position against said ledge means, thereby to permit the circuit board to be mounted in said housing automatically upon its introduction therein, without resort to separate fastening means or tools.

* * * * *